(12) United States Patent
Shubert et al.

(10) Patent No.: US 6,365,521 B1
(45) Date of Patent: Apr. 2, 2002

(54) PASSIVATION FOR TIGHT METAL GEOMETRY

(75) Inventors: Jan V. Shubert, Sunnyvale; Glen Wada, Fremont; Mansour Moinpour, Cupertino; Yang-Chin Shih, Fremont; Ken Schatz, Palo Alto, all of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/001,265

(22) Filed: Dec. 31, 1997

(51) Int. Cl.$^7$ ................................................ H01L 21/302
(52) U.S. Cl. ........................ 438/691; 438/692; 438/694; 257/529
(58) Field of Search ............................ 438/690, 691, 438/692, 693, 626, 631, 632, 5, 14; 216/84, 85; 451/286, 287, 288; 257/529

(56) References Cited

U.S. PATENT DOCUMENTS

| | | | | |
|---|---|---|---|---|
| 5,294,295 A | * | 3/1994 | Gabriel | 156/657 |
| 5,302,551 A | * | 4/1994 | Iranmanesh et al. | 438/693 |
| 5,445,996 A | * | 8/1995 | Kodera et al. | 438/633 |
| 5,502,007 A | * | 3/1996 | Murase | 438/692 |
| 5,629,242 A | * | 5/1997 | Nagashima et al. | 438/692 |
| 5,639,697 A | * | 6/1997 | Weling et al. | 438/691 |
| 5,798,298 A | * | 8/1998 | Yang et al. | 438/631 |
| 5,844,295 A | * | 11/1999 | Tsukude et al. | 257/529 |
| 5,985,747 A | * | 11/1999 | Taguchi | 438/622 |

* cited by examiner

Primary Examiner—Benjamin L. Utech
Assistant Examiner—Duy-Vu Deo
(74) Attorney, Agent, or Firm—Blakely, Sokoloff, Taylor & Zafman LLP

(57) ABSTRACT

A method of passivating an integrated circuit comprising providing an integrated circuit having a top side including a bond pad, depositing a first dielectric over said top side of said integrated circuit, exposing a first area portion of a top side of said bond pad, depositing a second dielectric of one of a material that is substantially impermeable to moisture over said top side of said integrated circuit, and exposing a second area portion of said top side of said bond pad, said second area portion within said first area portion is disclosed.

13 Claims, 7 Drawing Sheets

PASSIVATION FOR TIGHT METAL GEOMETRY

BACKGROUND OF THE INVENTION

1. Field of the Invention

The invention relates generally to the field of integrated circuit devices and more particularly to the passivation of such devices.

2. Description of Related Art

In general, an integrated circuit chip is made up of millions of individual devices coupled together in an integrated way through conductive metal lines. The interconnection of individual devices requires multiple layers of metal lines, such as for example five metal lines. The individual metal lines are insulated from one another by dielectric material, such as for example silicon dioxide ($SiO_2$). Located on the periphery of the integrated circuit chip are bond pads. To activate the circuitry within the chip, it is necessary to supply a voltage to the bond pads. These voltage signals are supplied to the bond pads through a package to which the integrated circuit device is affixed. After the chip is affixed to a package, individual bond wires are used to electrically couple each bond pad to a corresponding pad on a package substrate. Each corresponding pad on a package substrate is then individually coupled to an external pin. The packaged integrated circuit device may then be placed within a socket in order to electrically couple the external pins to drivers that supply the necessary voltage signal to activate the integrated circuit chip.

In general, overlying the periphery of the chip is a passivation layer through which bond pad openings are formed. The main purpose of the passivation layer is to provide electrical stability to a chip by isolating the chip surface from electrical and chemical conditions in the environment. The passivation layer must also protect the device from mechanical damage during all assembly and packaging operations.

Today, the most common method used to produce a passivation layer on the periphery of a chip is by chemical vapor deposition of silicon nitride ($Si_3N_4$) and/or silicon oxynitride ($SiO_xN_y$) with silicon nitride providing better isolation from the exterior environment than silicon oxynitride. Silicon nitride and silicon oxynitride are preferred choices because these materials protect the integrated circuit device better from environmental to effects, particularly moisture, than other dielectric materials, such as $SiO_2$. Chemical vapor deposited silicon nitride, for example, exhibits little or no permeability to moisture as noted, for example, in "Silicon Processing for the VLSI Era," Volume 1-Process Technology, Wolf, S. and Tauber, R. N., Lattice Press, 1986, pages 191–94.

In order to provide a necessary level of isolation and protection, particularly from moisture, a certain thickness of silicon nitride and/or silicon oxynitride passivation layer must be deposited. The thickness of the layer depends on the needed sidewall and bottom coverage of the ultimate layer of metal lines. One conventional standard is a passivation layer of at least 0.2 microns ($\mu m$). Current chemical vapor deposition (CVD) methods allow the achievement of this degree of step coverage for a minimum space between final metal lines of approximately 1 $\mu m$ or more. As geometries decrease, the space between metal lines also decreases which causes inadequate step coverage by the passivation layer over the final metal lines.

FIG. 1 shows a schematic, planar side view of a portion of an integrated circuit structure having three metal lines, 1, 2 and 3 atop substrate 10. Overlying metal lines 1, 2, and 3 is a conformally-deposited passivation layer 15 of silicon nitride or silicon oxynitride. In FIG. 1, the distance between metal line 1 and metal line 2 is less than 1.0 $\mu m$ while the distance between metal lines 2 and 3 is greater than 1.0 $\mu m$. FIG. 1 shows that the step coverage between metal lines 1 and 2 as a result of the non-conformal deposition of silicon nitride or silicon oxynitride, is less than desired, for example less than 0.2 $\mu m$. This follows because during the CVD deposition, the silicon nitride or silicon oxynitride is "pinched-off" between metal lines 1 and 2 and therefore cannot achieve the desired step coverage. This pinching-off causes a tunnel 20 to be formed between metal lines 1 and 2.

The deposition between metal lines 1 and 2 is to be compared with the deposition between metal lines 2 and 3. Between metal lines 2 and 3, the CVD deposition of silicon nitride or silicon oxynitride 15 does not get pinched-off due to the spacing geometry between metal lines 2 and 3 which is greater the 1.0 $\mu m$. Thus, a portion of metal line 2 and metal line 3 receive adequate step coverage of passivation layer 15.

FIG. 2 shows a schematic, perspective top view of integrated circuit structure 10 and metal lines 1 and 2. In FIG. 2, metal lines 1 and 2 are patterned to turn approximately 90° atop integrated circuit structure 10. This turn would be associated with, for example, coupling to bond pads 25 and 30, respectively. In FIG. 2, metal lines 1 and 2 are patterned to be less than 1.0 $\mu m$ apart. FIG. 2 shows pinching-off of the CVD deposition of silicon nitride or silicon oxynitride 15 between metal lines 1 and 2. This pinching-off creates a tunnel 20 between the metal lines 1 and 2. If this tunnel is open as, for example, when the metal lines are coupled to bond pads 25 and 30, respectively, environmental impurities, such as for example moisture, can get in tunnel 20 and attack metal lines 1 and 2 at areas having insufficient step coverage.

One prior art method to improve the step coverage over the top metal lines involves the deposition of an oxide prior to as the deposition of the silicon nitride or silicon oxynitride. FIG. 3 is an example of such a prior art method. FIG. 3 shows a schematic, planar side view of an integrated circuit structure 35 having metal lines 36 and 37 on the top surface or periphery of integrated circuit structure 35 together with bond pad 38. In FIG. 3, metal lines 36 and 37 and bond pad 38 are insulated by an oxide 40, such as for example CVD-deposited $SiO_2$. Overlying $SiO_2$ layer 40 is silicon nitride or silicon oxynitride layer 45. In FIG. 3, an opening 50 has been etched to bond pad 38 to allow connection to bond pad 38 by an integrated circuit package (not shown).

As illustrated in FIG. 3, a CVD-deposited $SiO_2$ provides excellent step coverage over metal lines 36 and 37. Unfortunately, oxide does not provide the necessary moisture barrier properties demonstrated by silicon nitride or silicon oxynitride. Accordingly, as shown in FIG. 3, once opening 50 is made to bond pad 38, moisture can attack oxide 40 and travel to metal lines 36 and 37 and have deleterious effects on metal lines 36 and 37. Thus, although metal lines 36 and 37 possess adequate step coverage properties, the step coverage is of a material that will not protect the metal lines from attack by environmental effects such as moisture.

SUMMARY OF THE INVENTION

A method of passivating an integrated circuit is disclosed. The method includes providing an integrated circuit having a top side including a bond pad, depositing a first dielectric over the top side of the integrated circuit, exposing a first area portion of a top side of the bond pad, depositing a second dielectric of a material that is substantially impermeable to moisture over the top side of the integrated circuit, and exposing a second area portion of the top side of the bond pad, the second area portion within the first area portion.

Other features and advantages of the invention are described herein with reference to the figures and the detailed description.

DETAILED DESCRIPTION OF THE INVENTION

The invention relates to a method of passivating an integrated circuit structure. The passivation techniques described herein are particularly useful for passivating the top or peripheral metal layers of an integrated circuit structure. An advantage of the methods described herein is that the metal layers of the integrated circuit structure may be insulated with sufficient step coverage and protected from environmental damage, particularly moisture.

In the following detailed description, numerous specific details, including processing steps and materials, are described. It is to be appreciated that these specific details need not be specifically adhered to to practice the invention. In other instances, well known details, such as conventional processing steps, are not described in detail so as not to obscure the nature of the invention.

Figure 4:
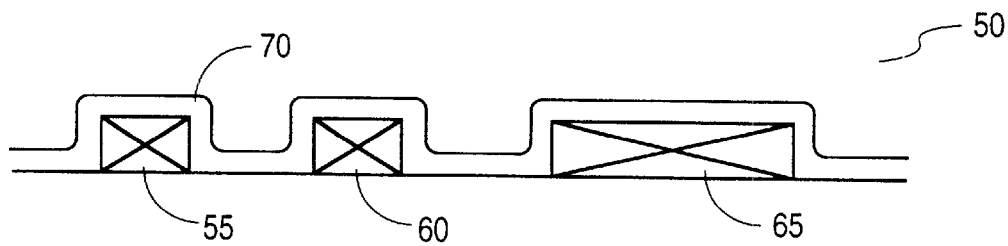
FIG. 4 is a schematic, planar side view of a portion of the top portion of an integrated circuit structure passivated with a layer of silicon nitride or silicon oxynitride in accordance with a first embodiment of the invention.

FIGS. 4–7 schematically illustrate one embodiment of passivating the periphery of an integrated circuit structure in accordance with the invention. FIG. 4 illustrates a planar side view of a top portion of an integrated circuit structure. FIG. 4 shows an integrated circuit structure 50 having a top surface including metal lines 55 and 60 as well as bond pad 65. The metal lines and bond pad overly a terminal layer of dielectric material such as an oxide. In FIG. 4, metal lines 55 and 60 may be separated by a distance of less than 1.0 $\mu$m, such as for example 0.5 $\mu$m or less. Overlying metal lines 55 and 60 and bond pad 65 is a conformally-deposited first layer of dielectric material 70. First dielectric material 70 is, for example, an oxide such as, for example, a CVD-deposited tetraethylorthosilicate (TEOS). In FIG. 4, first dielectric layer 70 is applied to a thickness of, for example, 0.2 $\mu$m to provide an adequate step coverage over metal lines 55 and 60 and bond pad 65.

Figure 5:
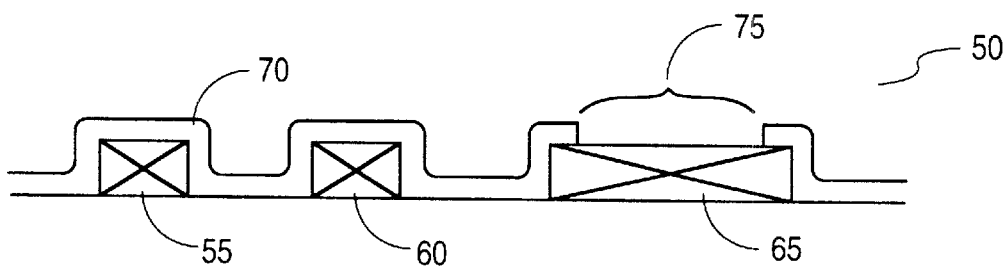
FIG. 5 is a planar side view of the integrated circuit structure of FIG. 4 illustrating the further processing step of forming an opening to a bond pad.

FIG. 5 illustrates the subsequent processing step of forming an opening through first dielectric layer 70 to bond pad 65. The etch may be carried out with a conventional etchant, such as for example $CHF_3/O_2$.

Figure 6:
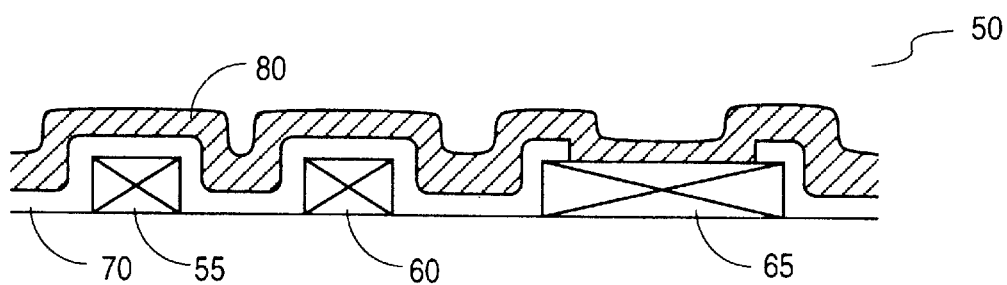
FIG. 6 is a planar side view of the integrated circuit structure of FIG. 4 illustrating the further processing step of depositing a layer of silicon nitride or silicon oxynitride.

FIG. 6 illustrates the subsequent processing step of depositing a second dielectric layer 80 over integrated circuit structure 50. As noted above, first dielectric layer 70 is an oxide. In general oxides do not provide adequate protection against environmental elements, particularly moisture. Accordingly, second dielectric layer 80 is a material that is resistant to these environmental effects. Second dielectric layer 80 material is substantially impermeable to moisture. Suitable material for second dielectric layer 80 include, but is not limited to, silicon nitride or silicon oxynitride. Second dielectric layer 80 is conformally deposited over the surface of integrated structure 50 including bond pad 65. In one embodiment, second dielectric layer is deposited to a thickness of greater than 0.2 $\mu$m.

Figure 7:
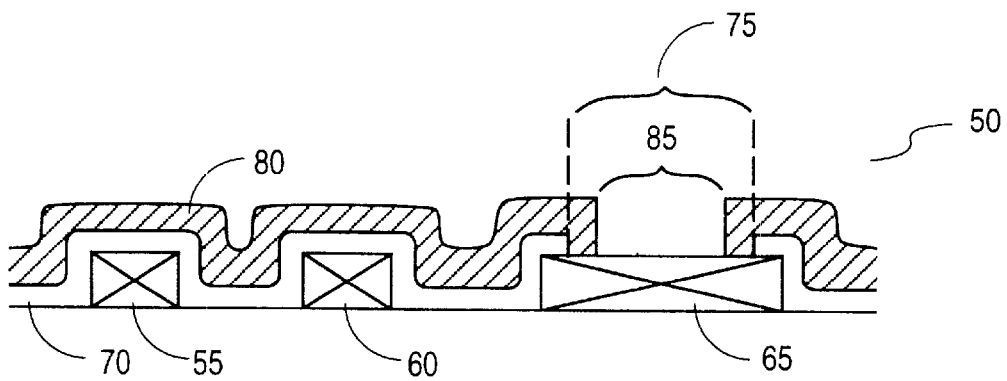
FIG. 7 is a planar side view of the integrated circuit structure of FIG. 4 illustrating the further processing step of forming an opening to a bond pad.

FIG. 7 illustrates the subsequent processing step of forming an opening through second dielectric layer 80 to bond pad 65. In FIG. 7, opening 85 is etched to bond pad 65 through second dielectric material 80. Opening 85 may be formed by way of a conventional etchant, such as for example $CF_4/O_2$ for silicon nitride. FIG. 7 shows that the area of opening 85 is less than the area of opening 75. This allows second dielectric layer 80 to be conformally deposited over dielectric layer 70, including over the region adjacent bond pad 65. Opening 85 allows a contact to be formed to bond pad 65 to, for example, provide power to the chip. Thus, as shown in FIG. 7, dielectric layer 70 is completely encompassed by second dielectric material 80.

The advantage of the processing steps described in FIGS. 4–7 is that second dielectric material 80, of a moisture resistant silicon nitride or silicon oxynitride, completely encompasses first dielectric layer 70 to provide an environmental barrier to first dielectric layer 70. In this manner, first dielectric layer 70 and metal lines 55 and 60 are protected from attack from environmental elements such as moisture.

Figure 8:
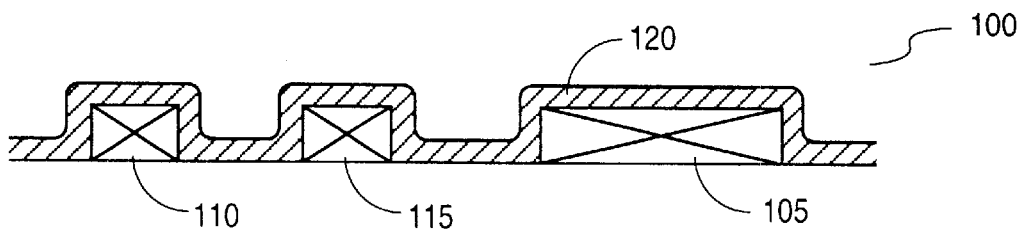
FIG. 8 is a schematic, planar side view of the top portion of an integrated circuit structure showing a thin passivation layer of silicon nitride or silicon oxynitride deposited over adjacent metal lines and a bond pad in accordance with a second embodiment of the invention.

FIGS. 8–12 schematically illustrate a second embodiment of the invention for passivating an integrated circuit structure. FIG. 8 shows a planar side view of a portion of the top portion of integrated circuit structure 100. The top portion of integrated circuit structure 100 includes metal lines 110 and 115 separated, for example, by a distance less than 1.0 $\mu$m. The top surface portion of integrated circuit structure 100 also includes bond pad 105. The metal lines and bond pad overly a terminal dielectric such as an oxide. In FIG. 8, conformally overlying the top surface portion of integrated circuit structure 100 is a layer of CVD-deposited first dielectric material 120. First dielectric material 120 is a material that is generally resistant to environmental elements. First dielectric material 120 is substantially impermeable to moisture. Suitable materials for first dielectric layer 120 include, but are not limited to, silicon nitride or silicon oxynitride. First dielectric layer 120 is deposited to a thickness of, for example, less than 0.2 $\mu$m. In this manner, first dielectric material 120 may not provide adequate step coverage but does not pinch-off or form a closed channel between metal lines 110 and 115.

Figure 9:
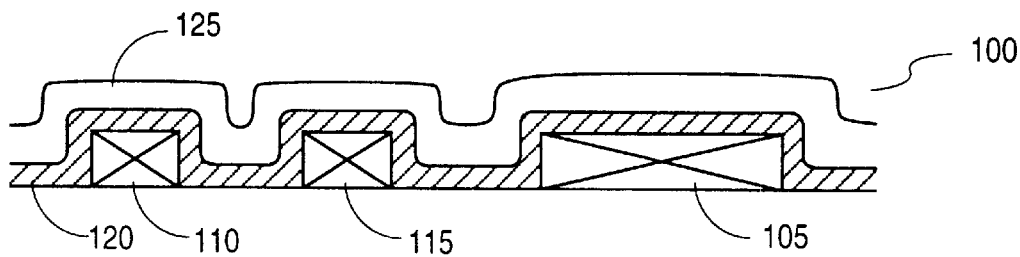
FIG. 9 is a planar side view of the integrated circuit structure of FIG. 8 illustrating the further processing step of depositing a second dielectric layer over the structure.

FIG. 9 shows the subsequent processing step of conformally depositing a relatively thick layer of second dielectric material 125 over first dielectric material 120.

Second dielectric layer 125 is, for example, an oxide such as CVD-deposited oxide that can provide adequate step coverage over tightly spaced metal lines 110 and 115. In one embodiment, CVD-deposited oxide is deposited to a thickness of greater than 1 $\mu$M.

Figure 10:
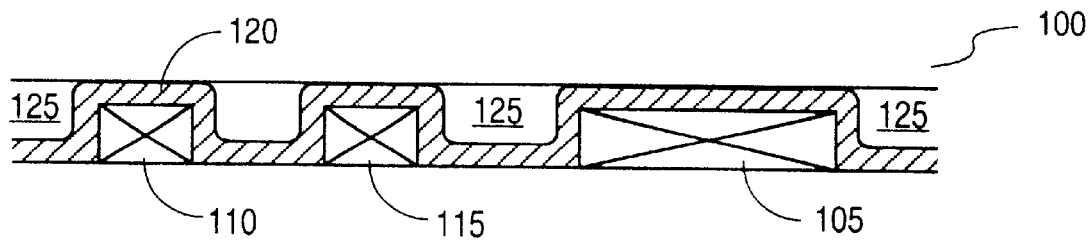
FIG. 10 is a planar side view of the integrated circuit structure of FIG. 8 illustrating the further processing step of planarizing the second dielectric layer.

Once second dielectric layer 125 is formed, the top surface of integrated circuit structure is planarized, such as for example by a chemical-mechanical polish (CMP) as shown in FIG. 10. Suitable CMP materials or slurries are known for planarizing oxide, silicon nitride, and silicon oxynitride. FIG. 10 shows the planarization proceeds to a point where the conformally deposited first dielectric material 120 is entirely planarized and exposed over bond pad 105.

Figure 11:
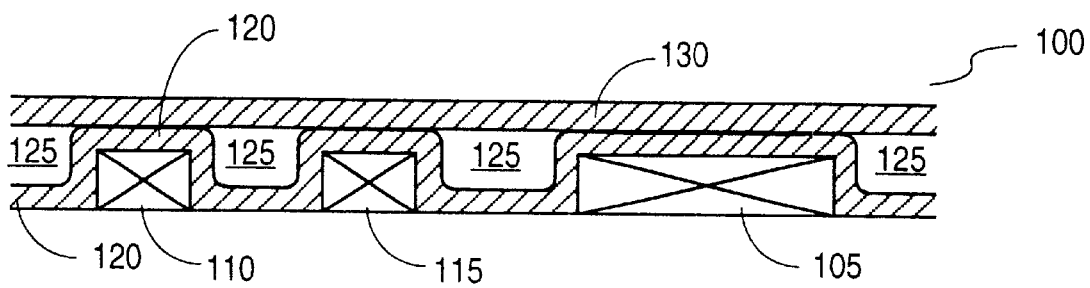
FIG. 11 shows a planar side view of the integrated circuit structure of FIG. 8 illustrating the further processing step of depositing a second layer of silicon nitride or silicon oxynitride over the structure.

FIG. 11 shows the subsequent processing step of depositing by CVD deposition a third dielectric layer 130 over the planarized region of integrated circuit structure 100. Third dielectric layer 130 is resistant to attack by environmental elements. Third dielectric layer 130 material is substantially impermeable to moisture. Suitable materials for third dielectric layer 130 include, but are not limited to, silicon nitride or silicon oxynitride deposited to a thickness of greater than 0.2 $\mu$m. As shown in FIG. 11, second dielectric layer 125 is completely encompassed within third dielectric layer 130 and first dielectric layer 120. Since first dielectric layer 120 and third dielectric layer 130 are chosen to be particularly resistant to attack or penetration by environmental effects such as moisture, second dielectric layer 125 is completely protected from such environmental effects.

Figure 12:
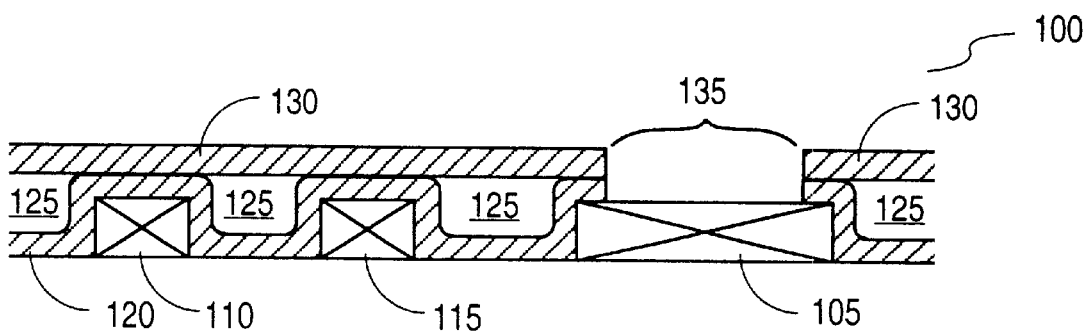
FIG. 12 shows a planar side view of the integrated circuit structure of FIG. 8 illustrating the further processing step of forming an opening to the bond pad.

FIG. 12 shows the subsequent processing step of if forming an opening 135 to bond pad 105. In the example where first dielectric layer 120 and third dielectric layer 130 are silicon nitride or silicon oxynitride, opening 135 is accomplished by way of a chemical etch, such as for example $CF_4/O_2$ for silicon nitride. As shown in FIG. 12, once opening 135 is formed, the only material possibly exposed through opening 135 is first dielectric material 120 and third dielectrical material 130, both of which are resistant to environmental effects such as moisture. Accordingly, metal lines 110 and 115 are provided with adequate step coverage by first and second dielectric layers 120 and 125 and are protected from the environment by first and third dielectric layers 120 and 130. A contact to bond pad 105 may be made to provide power to the chip.

FIGS. 13–18 illustrate a third embodiment of passivating an integrated circuit structure in accordance with the invention. The third embodiment seeks to improve the planarization step described above with reference to the second embodiment of the invention. The scheme utilizes the removal rate difference between different dielectrics to maximize the local removal rate at the bond pad area. Since a bond pad generally occupies more area over an integrated circuit chip than thin metal lines (e.g., metal lines having a width of 0.5 $\mu$m or less compared to a bond pad having a width of 30 $\mu$m or greater), a bond pad provides more area of passivation layer material during, for example, a CMP step. Accordingly, the removal rate of dielectric material by a CMP will be different over an area associated with a bond pad compared to an area overlying a metal line.

Figure 13:
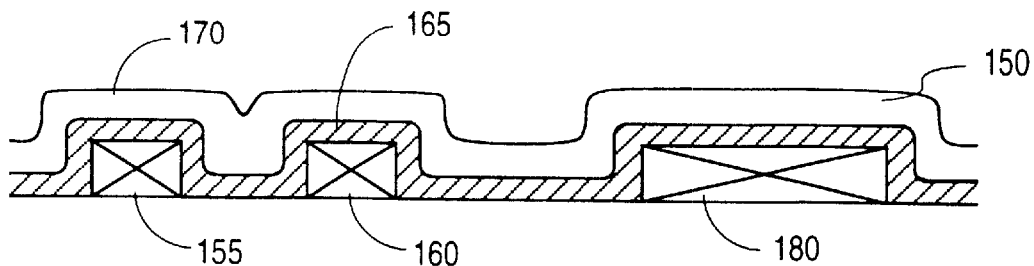
FIG. 13 shows a schematic, planar side view of a portion of the top portion of an integrated circuit structure having adjacent metal lines and a bond pad with a first dielectric of silicon nitride or silicon oxynitride overlying the metal lines and bond pad and a second dielectric overlying the first dielectric in accordance with a third embodiment of the invention.

FIG. 13 shows a planar side view of the top portion of a portion of an integrated circuit structure 150. The top portion of integrated circuit structure 150 shown in FIG. 13 includes metal lines 155 and 160, separated by a minimum geometry of, for example, less than 1.0 μm. In FIG. 13, a first dielectric layer 165 chosen to be resistant to environmental effects is conformally deposited via a CVD method over metal layers 155 and 160 and bond pad 180. First dielectric layer 165 material is substantially impermeable to moisture. Examples of such a dielectric include, but are not limited to, silicon nitride and silicon oxynitride. First dielectric layer 165 is deposited to a thickness that may provide inadequate step coverage but that will not result in pinching off the area between metal lines 155 and 160.

Overlying first dielectric layer 165 is a conformally deposited second dielectric layer 170 deposited to provide adequate step coverage over metal lines 155 and 160. In this embodiment, second dielectric layer 170 is deposited to a thickness substantially equivalent to the height of bond pad 180 and metal lines 155 and 160 (which, in this example, are of approximately similar height) less the thickness of first dielectric layer 165.

Figure 14:
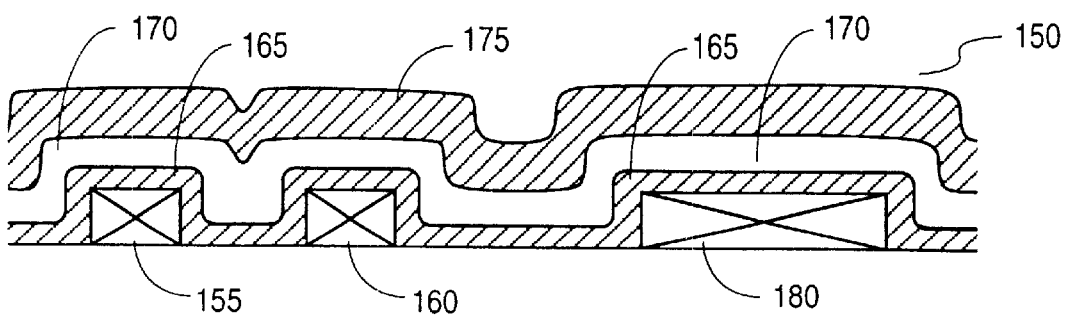
FIG. 14 shows a planar side view of the integrated circuit structure of FIG. 13 illustrating the further processing step of depositing a third dielectric layer of silicon nitride-or silicon oxynitride over the structure.

FIG. 14 shows the subsequent processing step of conformally depositing by a CVD method a third dielectric layer 175 over second dielectric layer 170. Third dielectric layer 175 is selected to be resistant to attack by environmental effects. Third dielectric layer 175 material is substantially impermeable to moisture. Suitable material for third dielectric layer 175 include, but are not limited to, silicon nitride or silicon oxynitride. Third dielectric layer 175 is deposited to a thickness that is at least equivalent to the step height of first dielectric layer 165 over metal lines 155 and 160 and bond pad 180.

Figure 15:
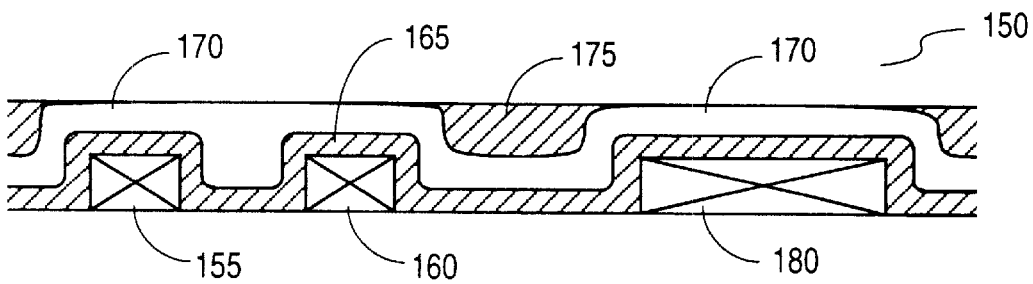
FIG. 15 shows a planar side view of the integrated circuit structure of FIG. 13 illustrating the further processing step of planarizing the integrated circuit structure to expose a portion of the second dielectric layer.

After the deposition of third dielectric layer 175, a planarization step, such as for example a CMP is performed to planarize the top surface of integrated circuit structure 150. FIG. 15 shows the partial planarization of the top surface of integrated circuit structure 150. FIG. 15 shows that third dielectric layer 175 is completely removed over the top surface of bond pad 180 and, in this example metal lines 155 and 160, revealing second dielectric 170 over the top surface of these structures.

Figure 16:
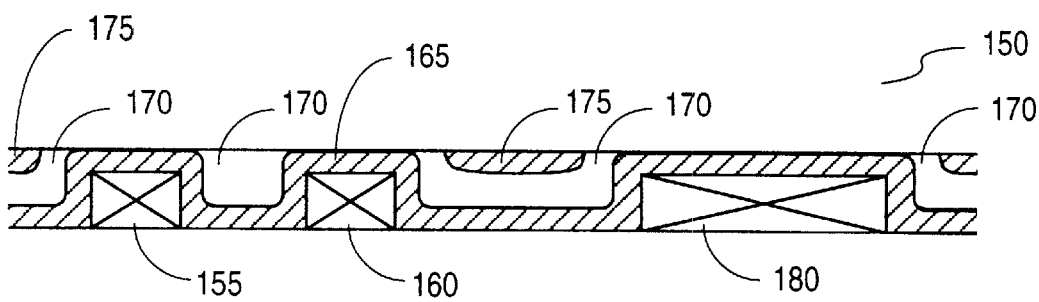
FIG. 16 shows a planar side view of the integrated circuit structure of FIG. 13 illustrating the further processing step of planarizing the structure to expose the first dielectric layer over the bond pad.

FIG. 16 shows the continued planarization of structure 150 such that first dielectric layer 165 is completely exposed over the top surface of bond pad 180 and, in this example, metal lines 155 and 160. FIG. 16 also shows that a portion of third dielectric material 175 remains between metal layer 160 and bond pad 180. This remainder of third dielectric layer 175 serves as a form of mechanical support for the planarization step so that the planarization rate is consistent across the top of integrated circuit structure 150 leaving structure 150 planarized. In other words, the remainder of third dielectric layer 175 material over regions adjacent metal lines 155 and 160 allows the CMP planarization to encounter more of third dielectric layer 175 material over areas not associated with bond pad 180, so that the polish proceeds over these areas at a rate more consistent with the rate of removal third dielectric layer 175 material over bond pad 180.

Figure 17:
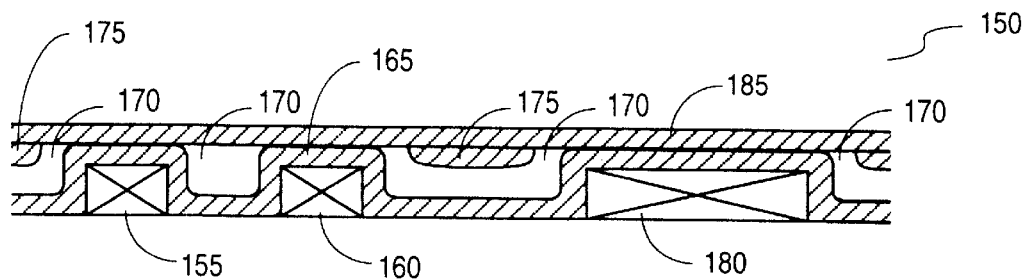
FIG. 17 shows the integrated circuit structure of FIG. 13 illustrating the further processing step of depositing a fourth layer of dielectric of silicon nitride or silicon oxynitride over the structure.

FIG. 17 shows the subsequent processing step of depositing by CVD deposition a fourth dielectric layer 185 that is resistant to environmental effects such as moisture. Suitable fourth dielectric material includes, but are not limited to, silicon nitride or silicon oxynitride. Fourth dielectric layer 185 is deposited to a thickness of, for example, 0.2 μm or greater.

Figure 18:
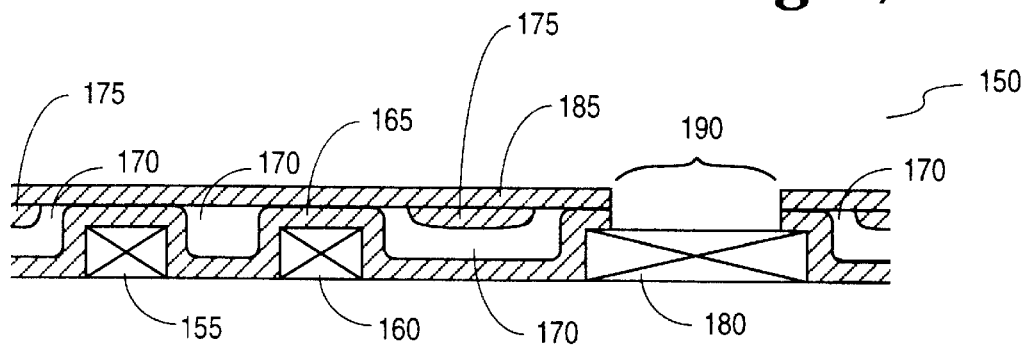
FIG. 18 shows the integrated circuit structure of FIG. 13 illustrating the further processing step of forming an opening to the bond pad.

FIG. 18 shows the next processing step of forming an opening 190 to bond pad 180 by way of a suitable etchant, such as for example $CF_4/O_2$ for silicon nitride. FIG. 18 shows that only first dielectric layer 165 and fourth dielectric layer 185 are exposed at bond pad opening 190. Accordingly, second dielectric 170 is completely protected from attack by environmental effects such as moisture by fourth dielectric layer 185 and first dielectric layer 165. A contact to bond pad 180 may be made to provide power to the chip.

In the third embodiment described above, dielectric material was deposited between metal lines/bond pads to control the rate of the polishing step across the surface of the chip. It is to be appreciated that other methods may be employed to achieve this result. One such method is illustrated in FIGS. 19–22. The method includes the placement of non-functioning/non-electrically connected "dummy" metal lines 215 adjacent metal lines 210 and bond pad 220. Dummy line 215 may be formed, for example, in the area adjacent metal line 160 and bond pad 180 and to a height substantially equivalent to the height of metal lines 205 and 210 and bond pad 220. In this manner, the conformal deposition of first dielectric layer 225 and second dielectric layer 230 will be substantially planar and the need for third dielectric layer will be obviated. It is to be appreciated that dummy line 215 serves as a support structure to control the rate of the polishing step and should be patterned accordingly, e.g., metal line, bond pad, etc. Dummy line 215 need not be a metal. Metal is chosen in this embodiment because of the convenience of depositing and patterning dummy line 215 with the other metal structures that overly the top surface portion of an integrated circuit structure and are the subject of the passivation process described herein.

Figure 19:
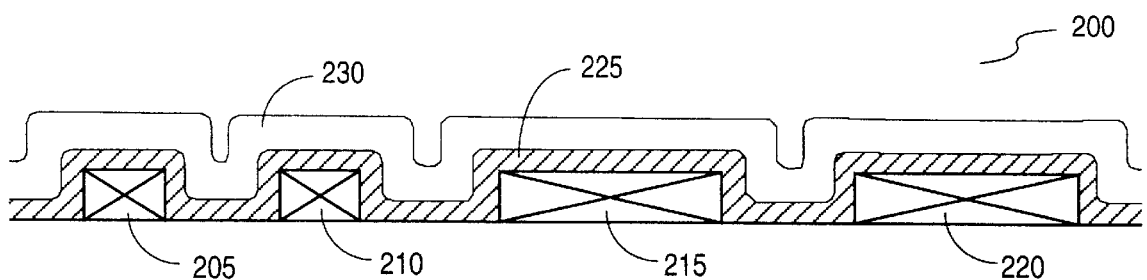
FIG. 19 shows a schematic, planar side view of a portion of the top portion of an integrated circuit structure having adjacent active metal lines, a second support structure, and a bond pad with a first dielectric of silicon nitride or silicon oxynitride overlying the metal lines and bond pad, and a second dielectric overlying the first dielectric layer in accordance with a fourth embodiment of the invention.

Instead, as shown in FIG. 19, first dielectric layer 225 is conformally deposited by CVD deposition over the top surface of integrated circuit structure 200. First dielectric layer 225 is chosen to be resistant to attack by environmental elements, particularly moisture. Suitable material for first dielectric layer 225 include, but are not limited to, silicon nitride and silicon oxynitride. First dielectric layer 225 is deposited to a thickness that may not provide adequate step coverage but does not pinch-off or form a closed channel between metal lines 205, 210, and 215. Next, second dielectric layer 230 is conformally deposited over integrated circuit structure 200. Second dielectric layer 230 is deposited to a thickness sufficient to provide adequate step coverage of metal lines 205, 210 and 215.

Figure 20:
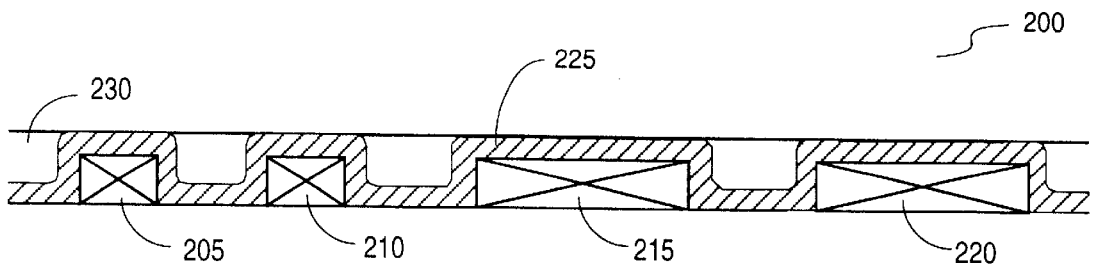
FIG. 20 shows a planar side view of the integrated circuit structure of FIG. 19 illustrating the further processing step of planarizing the structure to expose the first dielectric layer over the bond pad.

FIG. 20 shows the further processing step of planarizing the top surface of integrated circuit structure 200 with, for example, a CMP. The planarization step is sufficient to completely expose first dielectric layer 225 over bond pad 220.

Figure 21:
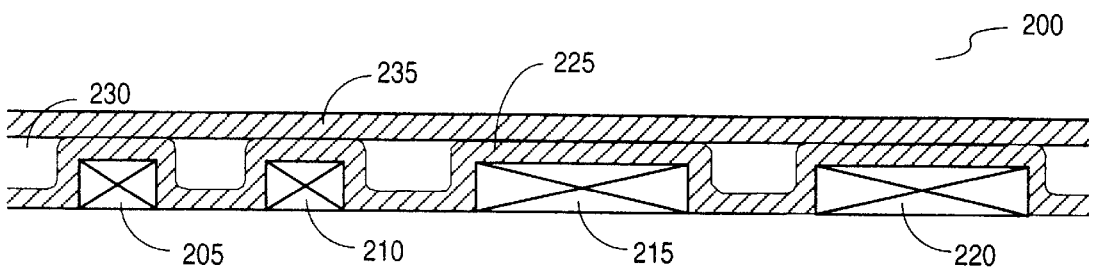
FIG. 21 shows the integrated circuit structure of FIG. 19 illustrating the further processing step of depositing a third layer of dielectric of silicon nitride or silicon oxynitride over the structure.
Figure 22:
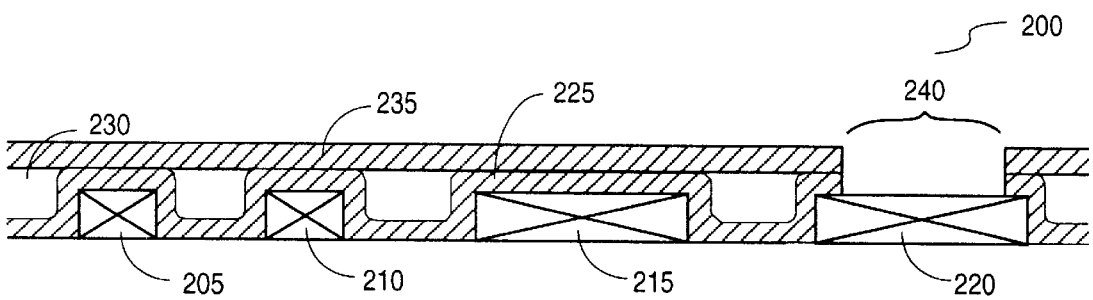
FIG. 22 shows the integrated circuit structure of FIG. 19 illustrating the further processing step of forming an opening to the bond pad.

FIG. 21 shows the further processing step of depositing a third dielectric layer 235 over the top surface of integrated circuit structure 200. Third dielectric layer 235 is chosen to be resistant to attack by environmental elements, particularly moisture. Suitable material for third dielectric layer 235 include, but are not limited to, silicon nitride and silicon oxynitride, is deposited to a thickness of 0.4 μm or greater. Finally, FIG. 22 shows the further processing step of forming opening 240 by a suitable etchant to bond pad 220 to allow electrical contact to bond pad 220. As shown in FIG. 22, opening 240 is formed through third dielectric layer 235 and first dielectric layer 225. Since both first dielectric layer 225 and third dielectric layer 235 are resistant to environmental attack from, for example, moisture, active metal lines 205 and 210 are completely protected.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A method of passivating an integrated circuit comprising:
   providing an integrated circuit having a top side having a portion including a bond pad having opposing side portions and a top surface defining a first area that are exposed;
   conformally depositing a first dielectric of a material that is substantially impermeable to moisture over said portion of said top side of said integrated circuit;
   conformally depositing a second dielectric over said first dielectric: to a thickness substantially equivalent to the step height of the bond pad less the thickness of said first dielectric;
   planarizing said top side of said integrated circuit to expose a top side portion of said first dielectric over said first area;
   depositing a third dielectric of a materiel that is substantially impermeable to moisture over said first area; and
   exposing a second area of said top side of said bond pad.

2. The method of claim 1, wherein depositing a first dielectric comprises depositing one of a silicon nitride and a silicon oxynitride and said second dielectric comprises an oxide.

3. The method of claim 2, wherein depositing a third dielectric comprises depositing one of a silicon nitride and a silicon oxynitride.

4. The method of claim 2, wherein prior to planarizing said integrated circuit, the method further comprises:
   conformally depositing a fourth dielectric of one of a silicon nitride and a silicon oxynitride over said first area.

5. The method of claim 1, wherein said first dielectric is an oxide.

6. A method of passivating an integrated circuit comprising:
   providing an integrated circuit having a top side having a portion including a bond pad having opposing side portions and a top surface defining a first area that are exposed;
   conformally depositing a first dielectric of a material that is substantially impermeable to moisture over said portion of said top side of said integrated circuit;
   conformally depositing a second dielectric over said first dielectric; to a thickness substantially equivalent to the step height of the bond pad less the thickness of said first dielectric;
   planarizing said top side of said integrated circuit to expose a top side portion of said first dielectric over said first area;
   depositing a third dielectric of a materiel that is substantially impermeable to moisture over said first area; and
   exposing a second area of said top side of said bond pad, wherein said top side of said integrated circuit includes a conductive material line and wherein said first dielectric is deposited to a thickness less than necessary to provide adequate step coverage over said conductive material line.

7. A method of passivating an integrated circuit comprising: a
   providing an integrated circuit having a top side portion including a bond pad having opposing side portions and a top surface defining a first area that are exposed;
   conformally depositing a first dielectric of a material that is substantially impermeable to moisture over said portion of said top side of said integrated circuit;
   conformally depositing a second dielectric over said first dielectric to a thickness no more than the step height of the bond pad less the thickness of said first dielectric;
   conformally depositing a third dielectric of a material that is substantially impermeable to moisture over said first area;
   planarizing said portion of said top side of said integrated circuit to expose a top side portion of said first dielectric over said first area;
   depositing a fourth dielectric of a material that is substantially impermeable to moisture over said first area; and
   exposing a second area of said top side of said bond pad.

8. The method of claim 7, wherein each of depositing said first dielectric, said third dielectric, and said fourth dielectric comprises depositing one of a silicon nitride and a silicon oxynitride.

9. The method of claim 7, wherein said top side of said integrated circuit includes a conductive material line and wherein said first dielectric is deposited to a thickness less than necessary to provide adequate step coverage over said conductive material line.

10. A method of passivating an integrated circuit comprising:
    providing an integrated circuit having a top side portion including a bond pad having opposing side portions and a top surface defining a first area that are exposed;
    conformally depositing a first dielectric of a material that is substantially impermeable to moisture over said portion of said top side of said integrated circuit;
    conformally depositing a second dielectric over said first dielectric to a thickness no more than the step height of the bond pad less the thickness of said first dielectric;
    conformally depositing a third dielectric of a material that is substantially impermeable to moisture over said first area;
    planarizing said portion of said top side of said integrated circuit to expose a top side portion of said first dielectric over said first area;
    depositing a fourth dielectric of a material that is substantially impermeable to moisture over said first area; and
    exposing a second area of said top side of said bond pad, wherein said second dielectric is deposited to a thickness substantially equivalent to the step height of the bond pad less the thickness of said first dielectric.

11. A method of passivating an integrated circuit comprising:

provinding an integrated circuit having a top side portion including a bond pad, a first conductive material line and a second conductive material line;

conformally depositing a first dielectric of a material that is substantially impermeable to moisture over said portion of said top side of said integrated circuit;

conformally depositing a second dielectric layer over said first dielectric; to a thickness substantially equivalent to the step height of the bond pad less the thickness of said first dielectric;

planarizing said portion of said top side of said integrated circuit to expose a top side portion of said first dielectric over said bond pad;

depositing a third dielectric of a material that is substantially impermeable to moisture over said bond pad; and exposing an area of a top side of said bond pad.

12. The method of claim 11, wherein each of depositing said first dielectric and said third dielectric comprises depositing one of a silicon nitride and a silicon oxynitride.

13. A method of passivating an integrated circuit comprising:

providing an integrated circuit having a top side portion including a bond pad, a first conductive material line and a second conductive material line;

conformally depositing a first dielectric of a material that is substantially impermeable to moisture over said portion of said top side of said integrated circuit;

conformally depositing a second dielectric layer over said first dielectric; to a thickness substantially equivalent to the step height of the bond pad less the thickness of said first dielectric;

planarizing said portion of said top side of said integrated circuit to expose a top side portion of said first dielectric over said bond pad;

depositing a third dielectric of a material that is substantially impermeable to moisture over said bond pad; and exposing an area of a top side of said bond pad, wherein said first dielectric is deposited to a thickness less than necessary to provide adequate step coverage over said first conductive material line and said second material line.

* * * * *

UNITED STATES PATENT AND TRADEMARK OFFICE
CERTIFICATE OF CORRECTION

PATENT NO. : 6,365,521 B1
DATED : April 2, 2002
INVENTOR(S) : Shubert et al.

Figure 1:
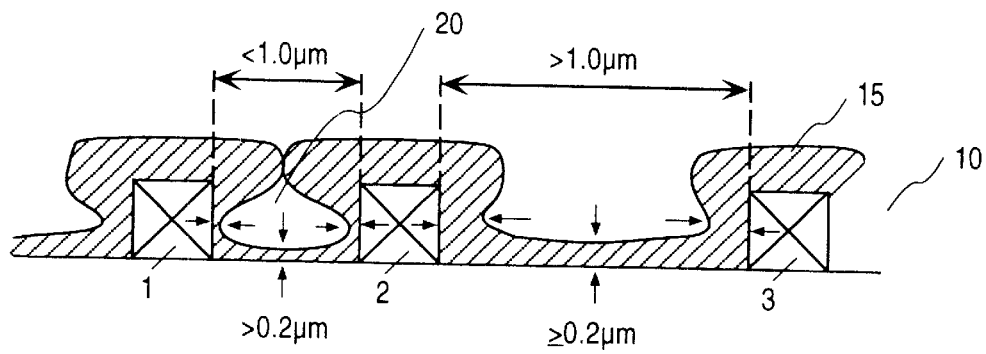
FIG. 1 is a planar side view of the top surface of a prior art integrated circuit structure.
Figure 2:
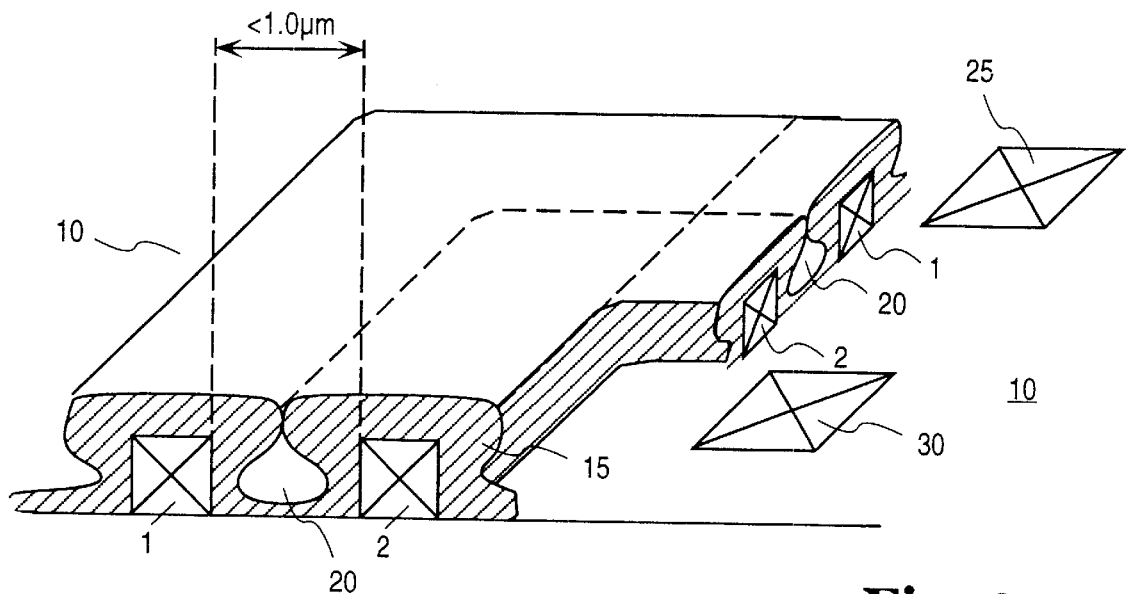
FIG. 2 is a perspective top view of the integrated circuit structure of FIG. 1.
Figure 3:
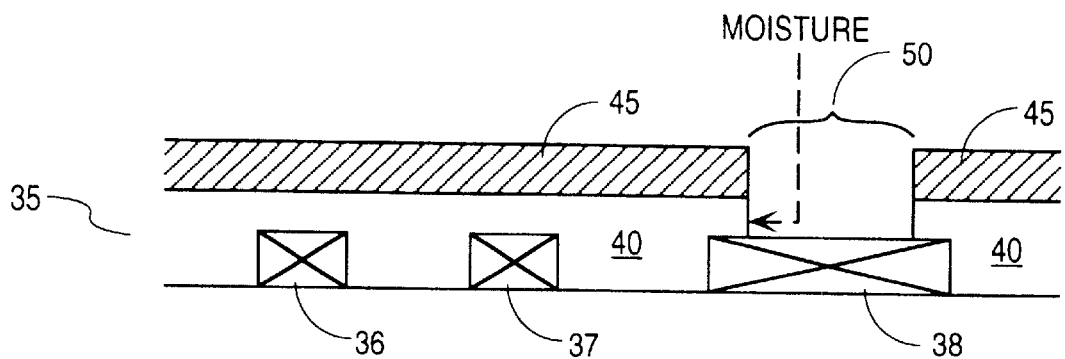
FIG. 3 is a planar side view of a portion of the top portion of a prior art integrated circuit structure passivated with both silicon oxide and silicon nitride or silicon oxynitride.

It is certified that error appears in the above-identified patent and that said Letters Patent is hereby corrected as shown below:

<u>Drawings,</u>
Fig. 1, delete ">0.2$\mu$m", insert -- <0.2$\mu$m --.

<u>Column 1,</u>
Line 46, before "effects", delete "to".

<u>Column 2,</u>
Line 40, before "the deposition", delete "as".

Signed and Sealed this

Twelfth Day of November, 2002

Attest:

Attesting Officer

JAMES E. ROGAN
*Director of the United States Patent and Trademark Office*